(12) United States Patent
Liu et al.

(10) Patent No.: US 12,237,354 B2
(45) Date of Patent: Feb. 25, 2025

(54) CHIP PACKAGE AND METHOD FOR FORMING THE SAME

(71) Applicant: XINTEC INC., Taoyuan (TW)

(72) Inventors: Tsang-Yu Liu, Zhubei (TW);
Shu-Ming Chang, New Taipei (TW);
Chaung-Lin Lai, Taoyuan (TW)

(73) Assignee: Xintec Inc., Taoyuan (TW)

( * ) Notice: Subject to any disclaimer, the term of this patent is extended or adjusted under 35 U.S.C. 154(b) by 389 days.

(21) Appl. No.: 17/683,917

(22) Filed: Mar. 1, 2022

(65) Prior Publication Data

US 2022/0285423 A1    Sep. 8, 2022

Related U.S. Application Data

(60) Provisional application No. 63/155,747, filed on Mar. 3, 2021.

(51) Int. Cl.
*H01L 27/146* (2006.01)

(52) U.S. Cl.
CPC .. *H01L 27/14632* (2013.01); *H01L 27/14601* (2013.01); *H01L 27/14634* (2013.01); *H01L 27/14636* (2013.01); *H01L 27/14689* (2013.01)

(58) Field of Classification Search
CPC .......................... H01L 27/146–14893
See application file for complete search history.

(56) References Cited

U.S. PATENT DOCUMENTS

| | | | |
|---|---|---|---|
| 5,851,084 A * | 12/1998 | Nishikawa | F16D 1/0864 403/373 |
| 7,569,409 B2 * | 8/2009 | Lin | H01L 27/14618 438/33 |
| 7,671,341 B2 * | 3/2010 | Jones | H01L 31/1032 250/370.01 |
| 10,038,026 B2 * | 7/2018 | Huang | H01L 27/1469 |

(Continued)

FOREIGN PATENT DOCUMENTS

| CN | 101950743 A | 1/2011 |
|---|---|---|
| CN | 102544035 A | 7/2012 |

(Continued)

OTHER PUBLICATIONS

Office Action dated Oct. 25, 2024, issued in counterpart CN patent application No. 202210204372.0, citing the above noted foreign patent publications.

*Primary Examiner* — David A Zarneke
(74) *Attorney, Agent, or Firm* — LIU & LIU

(57) ABSTRACT

Chip packages and methods for forming the same are provided. The method includes providing a substrate having upper and lower surfaces, and having a chip region and a scribe-line region surrounding the chip region. The substrate has a dielectric layer on its upper surface. A masking layer is formed over the substrate to cover the dielectric layer. The masking layer has a first opening exposing the dielectric layer and extending in the extending direction of the scribe-line region to surround the chip region. An etching process is performed on the dielectric layer directly below the first opening, to form a second opening that is in the dielectric layer directly below the first opening. The masking layer is removed to expose the dielectric layer having the second opening. A dicing process is performed on the substrate through the second opening.

23 Claims, 13 Drawing Sheets

(56) References Cited

U.S. PATENT DOCUMENTS

| | | | |
|---|---|---|---|
| 10,541,186 B2* | 1/2020 | Wang | H01L 24/96 |
| 2009/0072282 A1* | 3/2009 | Lee | H01L 27/14685 |
| | | | 257/292 |
| 2016/0099195 A1 | 4/2016 | Huang | |
| 2016/0163747 A1* | 6/2016 | Koide | H01L 27/14636 |
| | | | 257/432 |
| 2017/0179329 A1* | 6/2017 | Kawahara | H01L 31/036 |
| 2020/0044099 A1 | 2/2020 | Chang et al. | |

FOREIGN PATENT DOCUMENTS

| | | | |
|---|---|---|---|
| CN | 105489659 A | 4/2016 | |
| TW | 201631720 A | 9/2016 | |
| TW | 202008525 A | 2/2020 | |

\* cited by examiner

CHIP PACKAGE AND METHOD FOR FORMING THE SAME

CROSS REFERENCE TO RELATED APPLICATIONS

This application claims the benefit of U.S. Provisional Application No. 63/155,747, filed Mar. 3, 2021, the entirety of which is incorporated by reference herein.

BACKGROUND OF THE INVENTION

Field of the Invention

The invention relates to package technology, and in particular to a chip package and a method for forming the same.

Description of the Related Art

Optoelectronic devices (e.g. image-sensing devices) play an important role in capturing images and have been widely used in electronic products such as digital cameras, digital video recorders, and mobile phones. The chip packaging process is an important step in the fabrication of an electronic product. Chip packages not only protect sensing chips from outside environmental contaminants, but they also provide electrical connection paths between the electronic elements inside and those outside of the chip packages.

During the fabrication of the above-mentioned chip packages, individual chip packages are formed by singulation using a laser process and a dicing saw process. However, the dielectric material layer on the wafer (e.g., low-k dielectric material) is usually brittle, lacks mechanical strength, and is sensitive to thermal stress. As a result, debris, cracks, rough sidewalls, or other types of defects within the low-k dielectric material are likely to occur during the singulation process, reducing the yield of the chip package.

Accordingly, there is a need for a novel method for forming a package capable of eliminating or mitigating the aforementioned problems.

BRIEF SUMMARY OF THE INVENTION

An embodiment of the invention provides a method for forming a chip package including: providing a substrate that has an upper surface and a lower surface and has a chip region and a scribe-line region surrounding the chip region, in which there is a dielectric layer on the upper surface of the substrate; forming a masking layer over the substrate to cover the dielectric layer, in which the masking layer has a first opening exposing the dielectric layer and extending along the extending direction of the scribe-line region to surround the chip region; performing an etching process on the dielectric layer to form a second opening in the dielectric layer directly below the first opening; removing the masking layer to expose the dielectric layer that has the second opening; and performing a sawing process on the substrate through the second opening.

An embodiment of the invention provides a method for forming a chip package that includes: providing a substrate that has an upper surface and a lower surface and has adjacent first and second chip regions and a scribe-line region surrounding the first and second chip regions, in which there is a dielectric layer on the upper surface of the substrate; forming a masking layer over the substrate to cover the dielectric layer, in which the masking layer has first and second openings that expose the dielectric layer and extend in the extending direction of the scribe-line region to surround the first and second chip regions, respectively; performing an etching process on the dielectric layer directly below the first and second openings to form third and fourth openings formed in the dielectric layer directly below the first and second openings, respectively; performing a first sawing process sequentially on the masking layer and the dielectric layer to form a fifth opening surrounding the first and second chip regions and between the third opening and the fourth opening; removing the masking layer to expose the dielectric layer that has the fifth opening; and performing a second sawing process on the substrate through the fifth opening.

An embodiment of the invention provides a method for forming a chip package including: providing a substrate that has an upper surface and a lower surface and has adjacent first and second chip regions and a dicing line region surrounding the first and second chip regions, in which there is a dielectric layer on the upper surface of the substrate; forming a masking layer over the substrate to cover the dielectric layer, in which the masking layer has first and second openings exposing the dielectric layer and extending along the extending direction of the dicing line region to surround the first and the second chip regions, respectively; performing an etching process on the dielectric layer directly below the first and second openings to form third and fourth openings in the dielectric layer directly below the first and second openings, respectively; performing a sawing process sequentially on the masking layer, the dielectric layer, and the substrate to form a fifth opening surrounding the first and second chip regions and located between the third opening and the fourth opening, in which a bottom of the fifth opening is in the substrate; and performing a thinning process on the substrate from the lower surface of the substrate until the fifth opening is exposed.

An embodiment of the invention provides a chip package including a substrate, a dielectric layer, and an optical element. The substrate has a first surface and a second surface. The second surface of the substrate is opposite the first surface. The substrate has a sensing region adjacent to the second surface of the substrate. The dielectric layer has a first surface and a second surface. The second surface of the dielectric layer is opposite the first surface. The first surface of the dielectric layer adjoins the second surface of the substrate. The optical element is disposed on the second surface of the dielectric layer. The optical element is aligned with the sensing region. The first surface of the dielectric layer has less width than the first surface of the substrate. The dielectric layer has a tilted sidewall surface.

An embodiment of the invention provides a chip package including a substrate, a dielectric layer, and an optical element. The substrate has a first surface and a second surface. The second surface of the substrate is opposite the first surface. The substrate has a sensing region adjacent to the first surface of the substrate. The dielectric layer has a first surface and a second surface. The second surface of the dielectric layer is opposite the first surface. The first surface of the dielectric layer adjoins the second surface of the substrate. The optical element is disposed on the first surface of the substrate. The optical element is aligned with the sensing region. The substrate has a first tilted sidewall surface. The dielectric layer has a second tilted sidewall surface that is substantially aligned with the first tilted sidewall surface. The first tilted sidewall surface and the second tilted sidewall surface extend in the same direction.

An embodiment of the invention provides a chip package including a first chip, a first dielectric layer, and an optical element. The first chip includes a first substrate and a sensing region. The first substrate has a first surface and a second surface. The second surface of the first substrate is opposite the first surface. The sensing region is adjacent to the first surface of the first substrate. The first dielectric layer has a first surface and a second surface. The second surface of the first dielectric layer is opposite the first surface. The first surface of the first dielectric layer is adjoining the second surface of the first substrate. The optical element is disposed on the first surface of the first substrate. The optical element is aligned with the sensing region. The chip package also includes a second chip disposed below the first chip. The first substrate has a first tilted sidewall surface. The first dielectric layer has a second tilted sidewall surface. The second tilted sidewall surface is substantially aligned with the first tilted sidewall surface. The first tilted sidewall surface and the second tilted sidewall surface extend in the same direction.

BRIEF DESCRIPTION OF THE DRAWINGS

The present disclosure can be more fully understood by reading the subsequent detailed description and examples with references made to the accompanying drawings, wherein:

FIG. 2I-1 is a cross-sectional view of an exemplary chip package in accordance with some embodiments of the present disclosure.

DETAILED DESCRIPTION OF THE INVENTION

Figure 1A:
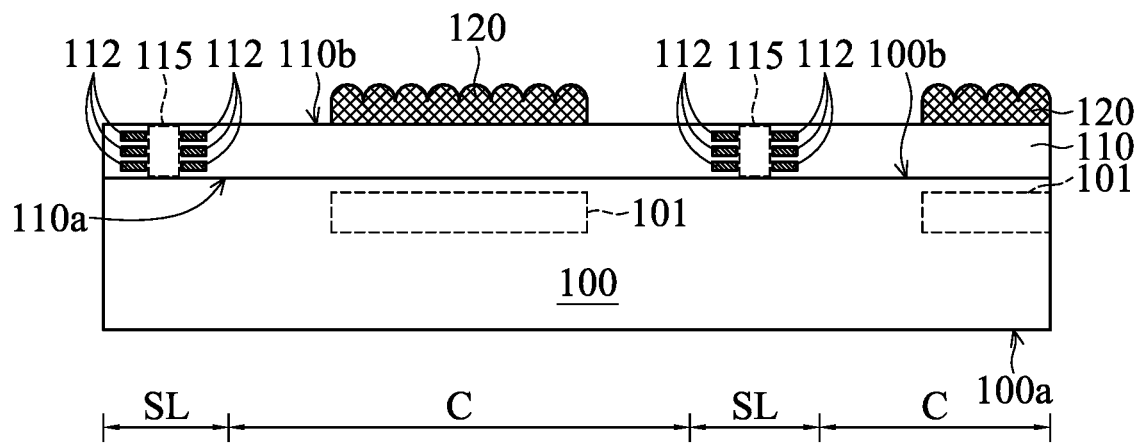
FIGS. 1A to 1H are cross-sectional views of an exemplary method for forming a chip package in accordance with some embodiments of the present disclosure.

The making and using of the embodiments of the present disclosure are discussed in detail below. However, it should be noted that the embodiments provide many applicable inventive concepts that can be embodied in a variety of specific methods. The specific embodiments discussed are merely illustrative of specific methods to make and use the embodiments, and do not limit the scope of the disclosure. In addition, the present disclosure may repeat reference numbers and/or letters in the various embodiments. This repetition is for the purpose of simplicity and clarity, and does not imply any relationship between the different embodiments and/or configurations discussed. Moreover, when a first material layer is referred to as being on or overlying a second material layer, the first material layer may be in direct contact with the second material layer, or separated from the second material layer by one or more material layers.

A chip package according to some embodiments of the present disclosure may be used to package micro-electromechanical system chips. However, embodiments of the invention are not limited thereto. For example, the chip package of the embodiments of the invention may be implemented to package active or passive devices or electronic components of integrated circuits, such as digital or analog circuits. For example, the chip package is related to optoelectronic devices, micro-electro-mechanical systems (MEMS), biometric devices, micro fluidic systems, and physical sensors measuring changes to physical quantities such as heat, light, capacitance, pressure, and so on. In particular, a wafer-level package (WSP) process may optionally be used to package semiconductor chips, such as image-sensor elements, light-emitting diodes (LEDs), solar cells, RF circuits, accelerators, gyroscopes, fingerprint recognition devices, micro actuators, surface acoustic wave devices, pressure sensors, ink printer heads, and so on.

The above-mentioned wafer-level package process mainly means that after the packaging step is accomplished during the wafer stage, the wafer with chips is cut to obtain individual packages. However, in a specific embodiment, separated semiconductor chips may be redistributed on a carrier wafer and then packaged, which may also be referred to as a wafer-level package process. In addition, the above-mentioned wafer-level package process may also be adapted to form a chip package having multi-layer integrated circuit devices by a stack of a plurality of wafers having integrated circuits.

FIGS. 1A to 1F are cross-sectional views of a method for forming a chip package 10 according to some embodiments of the present disclosure. In some embodiments, the chip package 10 is implemented as a front side illumination (FSI) sensing device. However, in some other embodiments, the chip package can also be implemented as a back side illumination (BSI) sensing device or a stack of chips having a back side illumination (BSI) sensing device and other semiconductor devices.

Referring to FIG. 1A, a substrate 100 is provided. The substrate 100 has a lower surface 100a and an upper surface 100b opposite thereto, and has chip regions and a scribe-line region surrounding these chip regions and separating adjacent chip regions. Herein, for simplicity, only a complete chip region C, a portion of the adjacent chip region C, and a scribe-line region SL separating these chip regions C are depicted. In other embodiments, the substrate 100 is a silicon substrate or another semiconductor substrate.

The chip region C of the substrate 100 includes a sensing region 101, and the sensing region 101 is adjacent to the upper surface 100b of the substrate 100. Moreover, the sensing region 101 may include sensing devices (not shown), which are also adjacent to the upper surface 100b of the substrate 100. For example, the sensing region 101 includes image-sensing devices or other suitable sensing devices. In some embodiments, the sensing region 101 include a device that is configured to sense biometrics (e.g., a fingerprint recognition device), a device that is configured to sense environmental characteristics (e.g., a temperaturesensing element, a humidity-sensing element, a pressure-sensing element, a capacitance-sensing element), or another suitable sensing element.

In some embodiments, a dielectric layer 110 is disposed on the upper surface 100b of the substrate 100, and the dielectric layer 110 includes an interlayer dielectric layer (ILD), an inter-metal dielectric layer, a passivation layer or a combination thereof. Herein, to simplify the diagram, only a flat layer is depicted. In some embodiments, the sensing devices within the sensing region 101 are electrically connected to each other through the interconnect structure (not shown) within the substrate 100 and the dielectric layer 110. In some embodiments, the dielectric layer 110 includes an inorganic material, such as silicon oxide, silicon nitride, silicon oxynitride, metal oxide, or a combination thereof or another suitable insulating material.

In some embodiments, the dielectric layer 110 has a metal-free region 115 and one or more metal layers 112 aligned with the scribe-line region SL of substrate 100. The metal-free region 115 extends from the upper surface 110b of dielectric layer 110 to the lower surface 110a of the dielectric layer 110. In some embodiments, the metal layer 112 may be a single layer or a multi-layer structure. For example, the metal layer 112 is a multi-layer structure that includes a test key, a guard ring, or a combination thereof. Herein, to simplify the diagram, only some single conductive layers 112 are depicted as an example.

In some embodiments, the front end process (e.g., the formation of the sensing region 101 in the substrate 100) and the back end process (e.g., the formation of the dielectric layer 110, interconnect structure and metal layer 112 on substrate 100) of the semiconductor device can be successively performed prior to the formation of the aforementioned structure. In other words, the following chip package forming method is used for the subsequent packaging process of the substrate that has completed the back end process.

In some embodiments, the chip region C has an optical element 120 disposed on the upper surface 110b of the dielectric layer 110 and aligned with the sensing region 101. In some embodiments, the optical element 120 includes a microlens array, a filter layer, a combination thereof, or other suitable optical element.

Figure 1B:
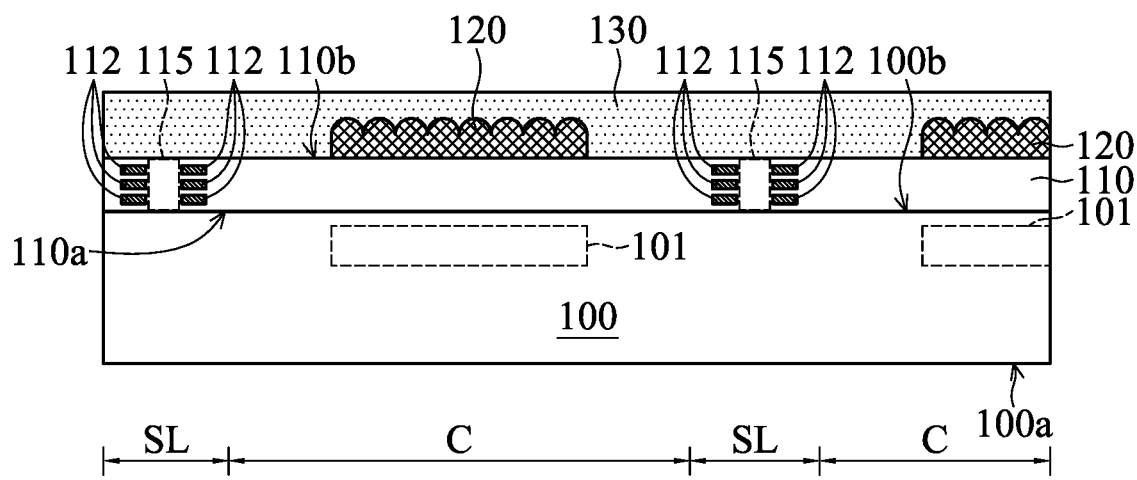

Next, referring to FIG. 1B, a masking layer 130 is formed over the upper surface 100b of the substrate 100 to completely cover the dielectric layer 110 and the optical element 120 overlying the dielectric layer 110. In some embodiments, the masking layer 130 serves as a protective layer during the singulation process. Moreover, the masking layer 130 also serves as an etching mask for the subsequent patterning of the dielectric layer 110. For example, the masking layer 130 may be a photoresist layer or other suitable layer of photosensitive material.

Figure 1C:
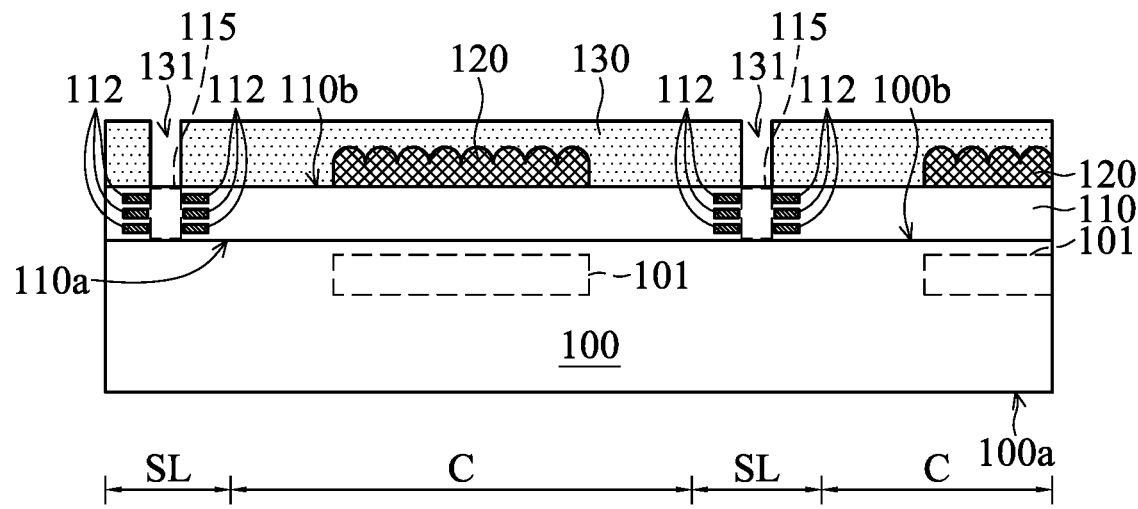

Referring to FIG. 1C, in some embodiments, after forming the masking layer 130, a patterning process (e.g., a lithography process) is performed to form an opening 131 in the masking layer 130. The opening 131 is aligned with the scribe-line region SL and exposes the upper surface 110b of the dielectric layer 110. Moreover, the opening 131 extends along the extending direction of the scribe-line region SL, so as to surround the chip region C. In some embodiments, the opening 131 is aligned with the metal-free region 115. For example, the opening 131 exposes the metal-free region 115 of the dielectric layer 110 and is not aligned with the metal layer 112.

Figure 1D:
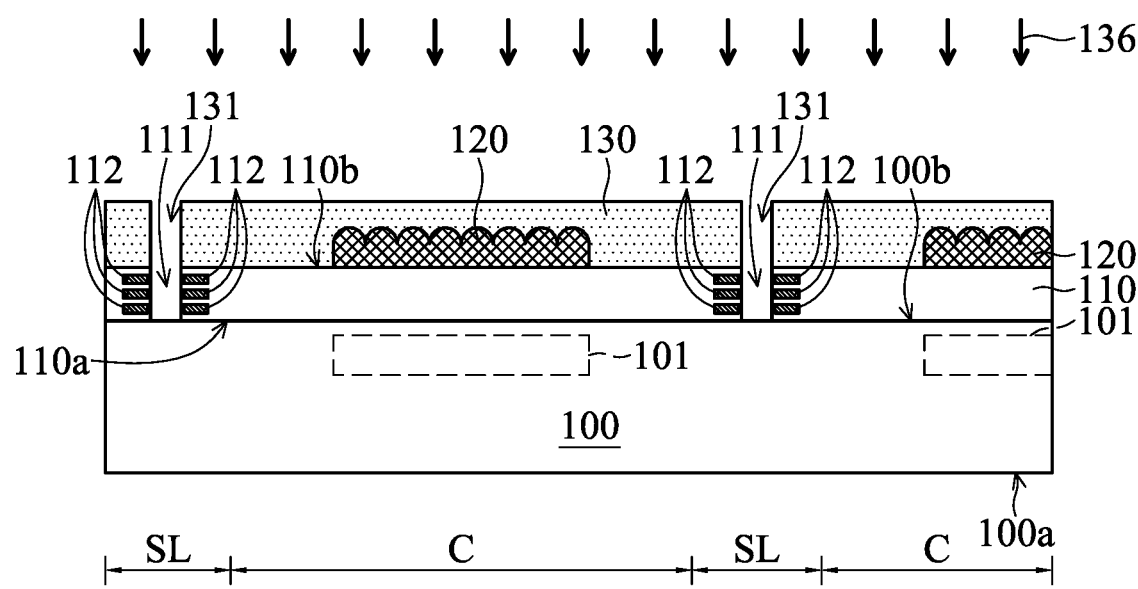

Referring to FIG. 1D, in some embodiments, after the opening 131 is formed, an etching process 136 is performed on the dielectric layer 110 directly below the opening 131 (i.e., the metal-free region 115) to remove the metal-free region 115 and form an opening 111 directly below the opening 131 and expose the upper substrate 100b of the substrate 100 In some embodiments, the etching process 136 includes a dry or wet etching process or another suitable process (e.g., plasma etching process or reactive ion etching process). The etching process 136 is a pre-sawing process, which prevents debris, cracks, or other types of defects from being formed in the portion of the dielectric layer 110 adjacent to the opening 111 as compared to a pre-sawing process using laser technology. Moreover, it is possible to prevent the formation of an opening 111 with rough sidewalls.

Figure 1E:
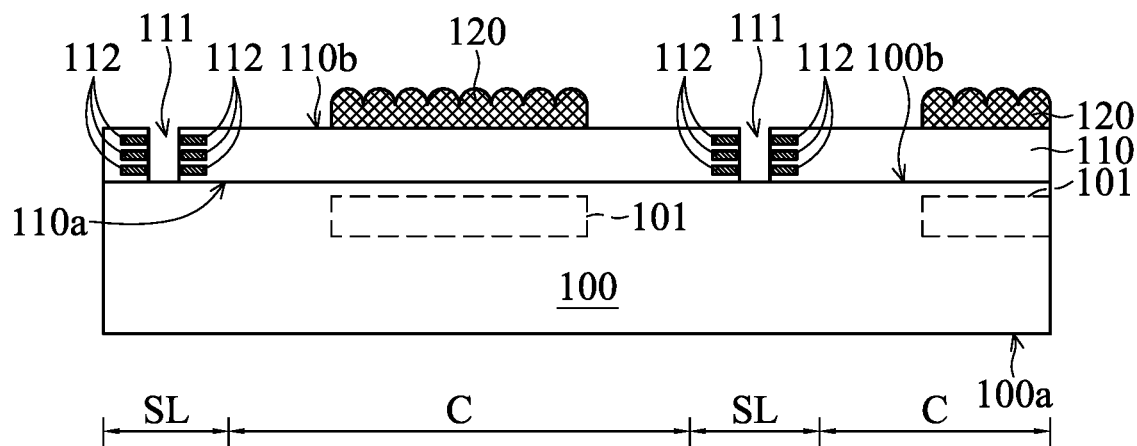

Referring to FIG. 1E, in some embodiments, after forming the opening 111, the masking layer 130 is removed to expose the dielectric layer 110 and the optical element 120. For example, the masking layer 130 can be removed in an ashing process or a wet stripping process to form the structure shown in FIG. 1E. In some embodiments, an optional clean process may be performed on the structure shown in FIG. 1E after the removal of the masking layer 130 to remove residues (not shown) resulting from the ashing process or the wet stripping process.

Figure 1F:
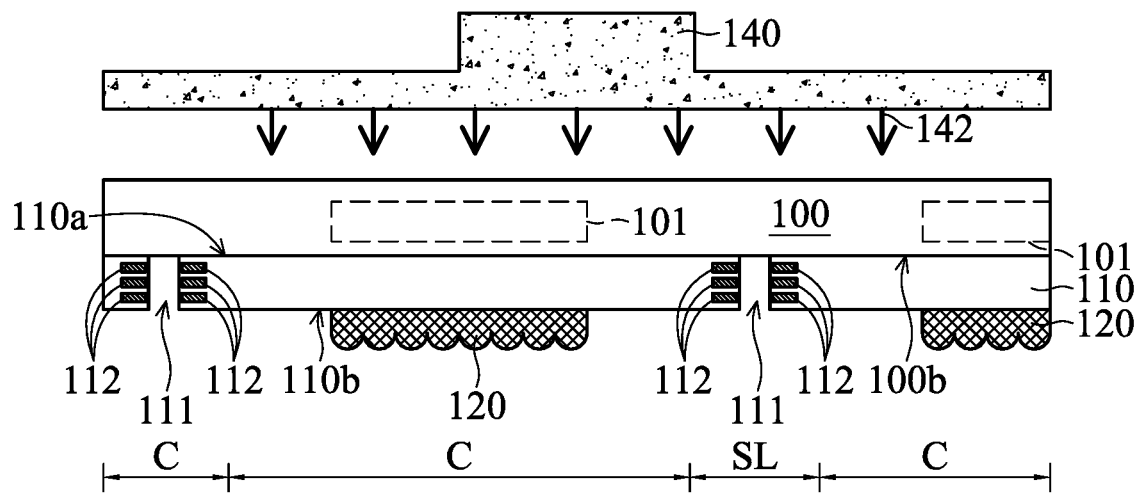

Referring to FIG. 1F, in some embodiments, after removing the masking layer 130 and performing the optional clean process (if present), a thinning process (e.g., etching process, milling process, grinding process, or polishing process) is performed on the substrate 100 from the lower surface 100a of the substrate 100 to reduce the thickness of the substrate 100. For example, a grinding process 142 is performed on the lower surface 100a from the substrate 100 using a grinding wheel 140.

Figure 1G:
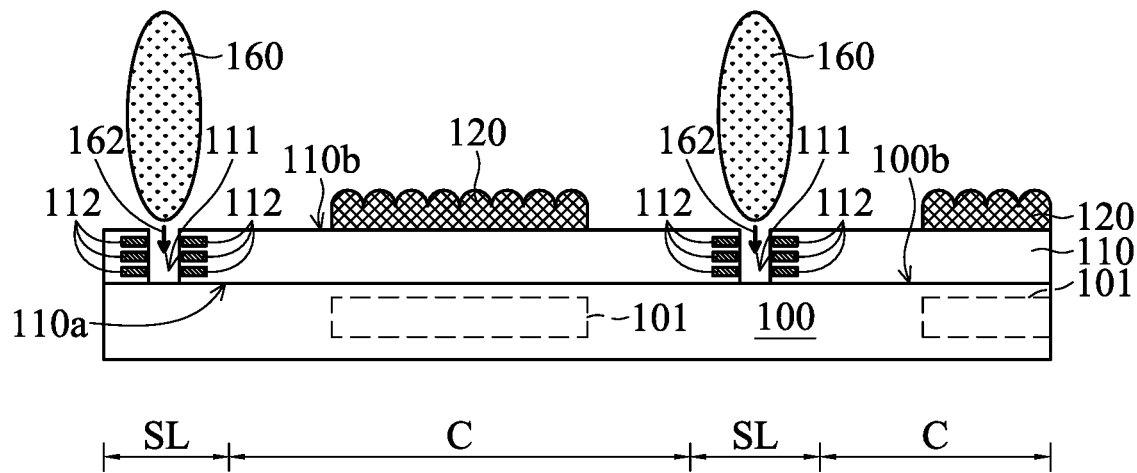
Figure 1H:
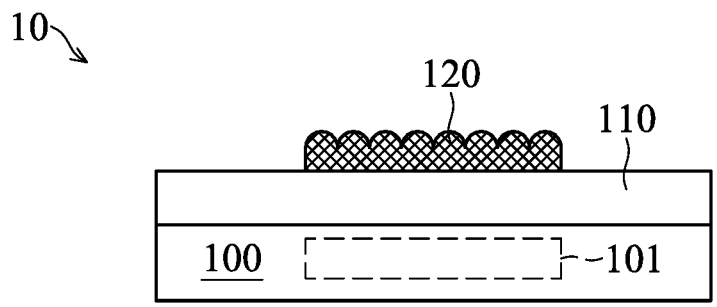

Referring to FIG. 1G, in some embodiments, after the thinning process, a sawing process is performed on the substrate 100 through the opening 111. More specifically, a sawing process 162 is performed along a direction from the upper surface 100b of the substrate 100 toward the lower surface 100a of the substrate 100 using a dicing saw 160, so that the adjacent chip regions C are separated from each other. After sawing process 162, an individual chip package 10 can be formed, as shown in FIG. 1H. Since the dicing saw 160 is not in contact with the dielectric layer 110 due to the previously formed opening 111 during the sawing process 162, it also can prevent debris, cracks, or other types of defects from being formed in the portion of the dielectric layer 110 adjacent to the opening 111. Moreover, it can prevent the formation of an opening 111 with rough sidewalls.

Figure 2A:
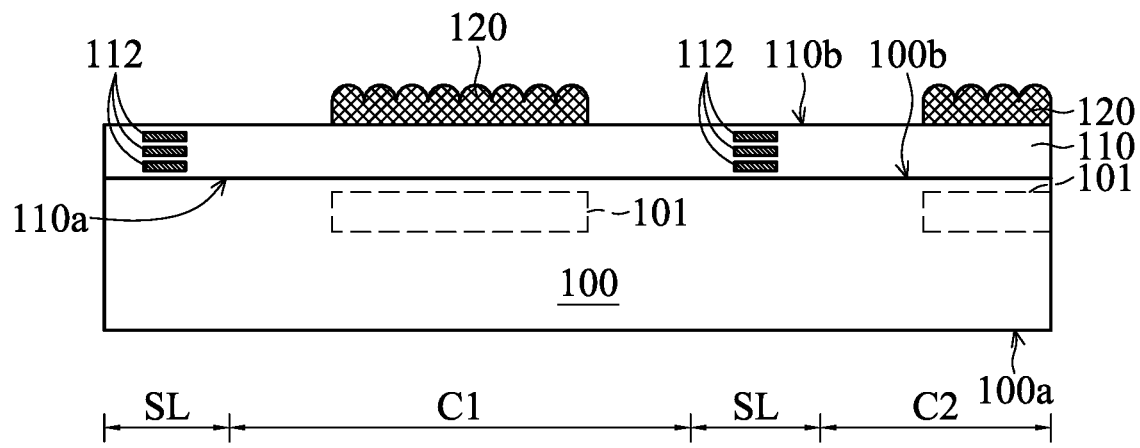
FIGS. 2A to 2I are cross-sectional views of an exemplary method for forming a chip package in accordance with some embodiments of the present disclosure.

FIGS. 2A to 2I are cross-sectional views of a method for forming a chip package 20 according to some embodiments of the present disclosure, in which elements in FIGS. 2A to 2I that are the same as those in FIGS. 1A to 1H are labeled with the same reference numbers as in FIGS. 1A to 1H and are not described again for brevity. Referring to FIG. 2A, a substrate 100 is provided. The substrate 100 has a lower surface 100a and an upper surface 100b opposite thereto, and having a plurality of chip regions and a scribe-line region surrounding these chip regions and separating the adjacent chip regions. Herein, for simplicity, only a complete chip region C1, a portion of chip region C2 adjacent thereto, and a scribe-line region SL separating chip regions C1 and C2 are depicted. Moreover, the sensing region 101 may include sensing devices (not shown), which are also adjacent to the upper surface 100b of the substrate 100.

In some embodiments, a dielectric layer 110 is provided on the upper surface 100b of the substrate 100. In some embodiments, the dielectric layer 110 has one or more metal layers 112 aligned with the scribe-line region SL of substrate 100. In some embodiments, the metal layer 112 may be a single layer or a multi-layer structure. For example, the metal layer 112 is a multilayer structure that includes a test key, a guard ring, or a combination thereof. Herein, for simplicity of the diagram, only some single conductive layers 112 are depicted as an example.

In some embodiments, the front end process (e.g., the formation of the sensing region 101 in the substrate 100) and the back end process (e.g., the formation of the dielectric layer 110, interconnect structure and metal layer 112 on substrate 100) of the semiconductor device can be successively performed prior to the formation of the aforementioned structure. In other words, the following chip package forming method is used for the subsequent packaging process of the substrate that has completed the back end process.

In some embodiments, chip regions C1 and C2 each have an optical element 120 (e.g., microlens array, color filter, a combination thereof, or another suitable optical element) disposed on the upper surface 110b of dielectric layer 110 and aligned with the sensing region 101.

Figure 2B:
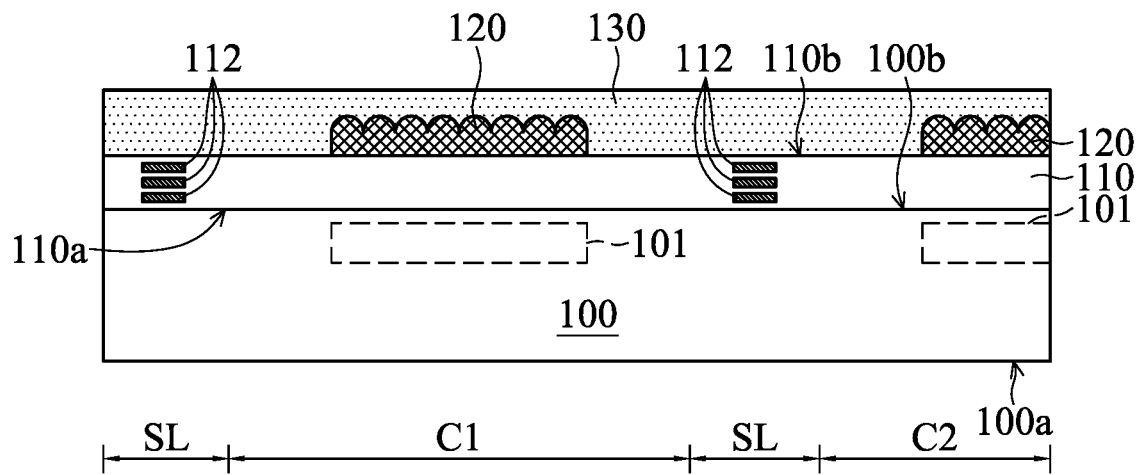

Next, referring to FIG. 2B, a masking layer 130 (e.g., a photoresist layer or another suitable photosensitive material layer) is formed over the upper surface 100b of the substrate 100 to completely cover the dielectric layer 110 and the optical element 120 overlying the dielectric layer 110.

Figure 2C:
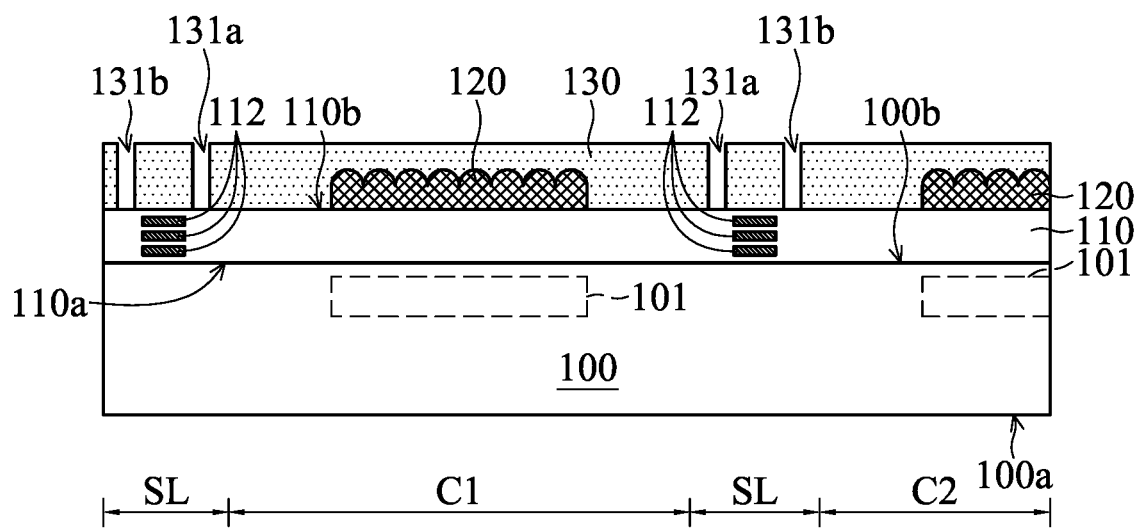

Referring to FIG. 2C, in some embodiments, after forming the masking layer 130, a patterning process (e.g., lithography process) is performed to form openings 131a and 131b in the masking layer 130. The openings 131a and 131b are aligned with the scribe-line region SL and expose the upper surface 110b of the dielectric layer 110. Moreover, the openings 131a and 131b extend along the direction of the extending direction of the scribe-line region SL, so as to surround the chip regions C1 and C2, respectively. In some embodiments, similar to the opening 131 shown in FIG. 1C, the dielectric layer 110 directly below the openings 131a and 131b also has a metal-free region (not shown). As a result, the openings 131a and 131b are also not aligned with the metal layer 112.

Figure 2D:
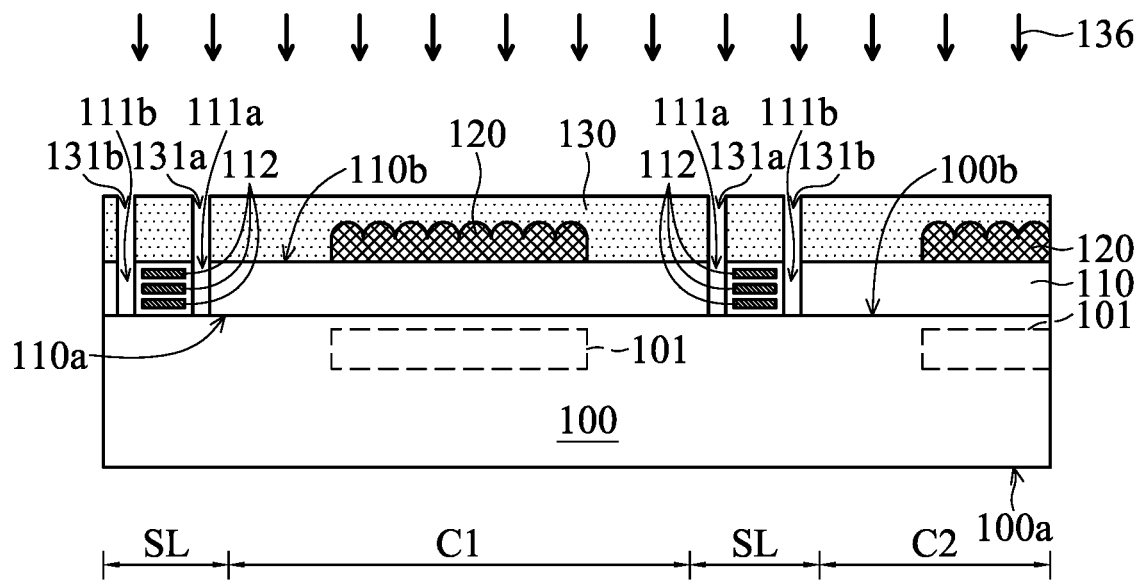

Referring to FIG. 2D, in some embodiments, after forming the openings 131a and 131b, an etching process 136 is performed on the dielectric layer 110 directly below the openings 131a and 131b to form openings 111a and 111b in the dielectric layer 110. The openings 111a and 111b are located directly below the openings 131a and 131b, respectively, and expose the upper surface 100b of the substrate 100. In some embodiments, the etching process 136 includes a dry or wet etching process or another suitable process (e.g., plasma etching process or reactive ion etching process).

Figure 2E:
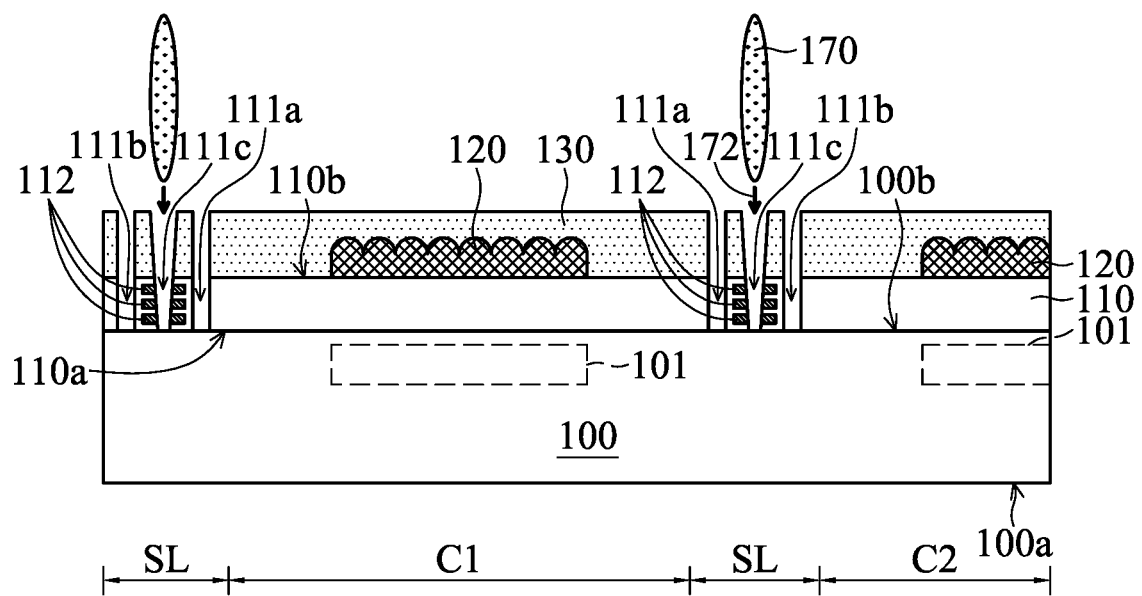

Referring to FIG. 2E, in some embodiments, after forming openings 111a and 111b, a sawing process is performed sequentially on masking layer 130 and dielectric layer 110. More specifically, a sawing process 172 is performed along a direction from the masking layer 130 toward the lower surface 110a of the dielectric layer 110 using a dicing saw 170, so as to form an opening 110c in the dielectric layer 110. Similar to the openings 111a and 111b, the opening 111c exposes the upper surface 100b of the substrate 100. Moreover, the opening 110c surrounds chip regions C1 and C2 and is located between the opening 111a and the opening 111b. During the sawing process 172, a portion of the metal layer 112 is removed along with the dielectric layer 110. The sawing process 172 is a pre-sawing process. During the sawing process 172, debris, cracks, or other types of defects are formed in the portion of the dielectric layer 110 that is aligned with the scribe-line region SL. Moreover, the opening 111c may have rough sidewalls. However, since the opening 111c is formed between the opening 111a and the opening 111b, the opening 111a and the opening 111b block these defects formed in the dielectric layer 110 surrounded by the opening 111a and the opening 111b (i.e., the portion of the dielectric layer 110 that is aligned with chip regions C1 and C2).

Figure 2F:
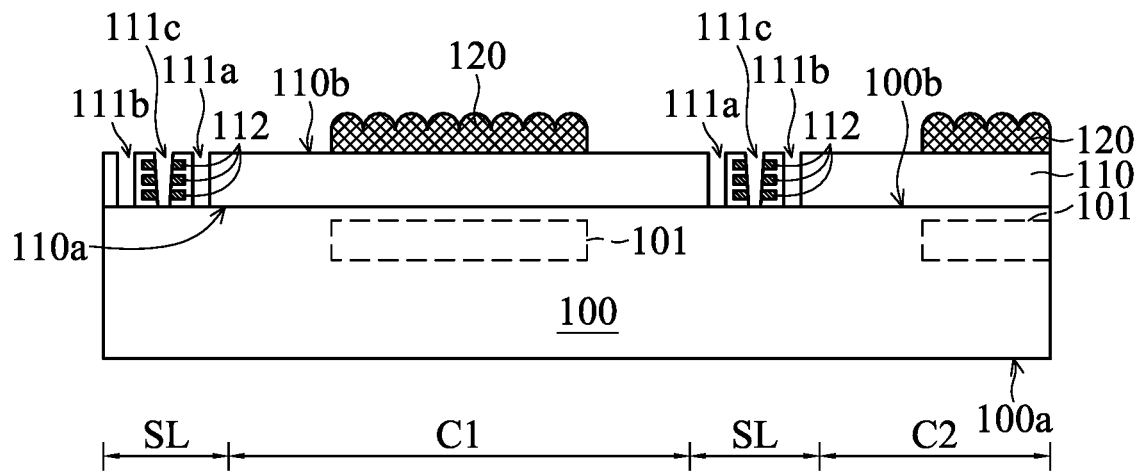

Referring to FIG. 2F, in some embodiments, after forming the opening 111c, the masking layer 130 is removed to expose the dielectric layer 110 and optical element 120. For example, the masking layer 130 can be removed by an ashing process or a wet stripping process to form the structure shown in FIG. 2F. In some embodiments, after removal of masking layer 130, an optional clean process is performed on the structure shown in FIG. 2F to remove residues (not shown) resulting from the ashing process or the wet stripping process.

Figure 2G:
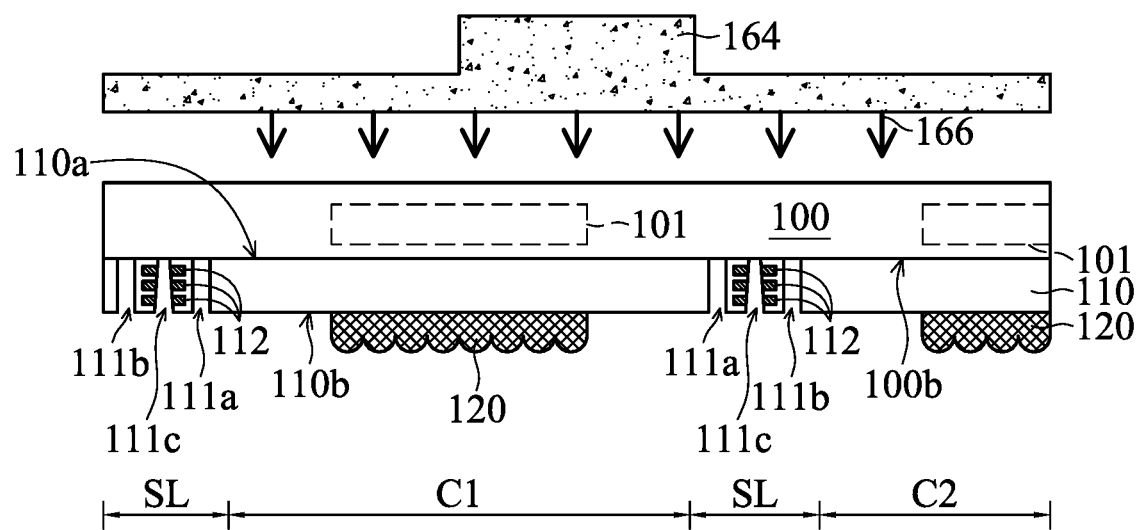

Referring to FIG. 2G, in some embodiments, in some embodiments, after removing the masking layer 130 and performing the optional clean process (if present), a thinning process (e.g., etching process, milling process, grinding process, or polishing process) is performed on the substrate 100 from the lower surface 100a of the substrate 100 to reduce the thickness of the substrate 100. For example, a grinding process 166 is performed on the lower surface 100a from the substrate 100 using a grinding wheel 164.

Figure 2H:
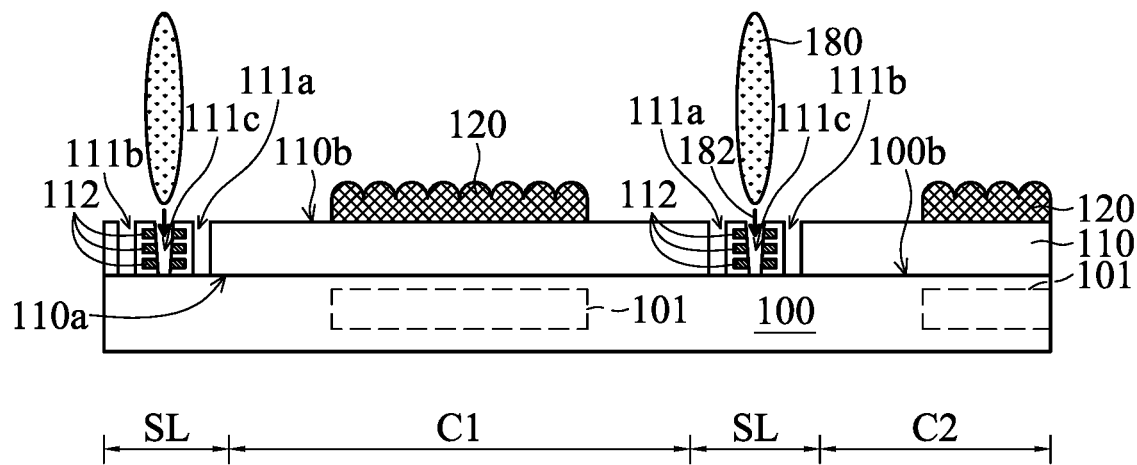
Figure 2I:
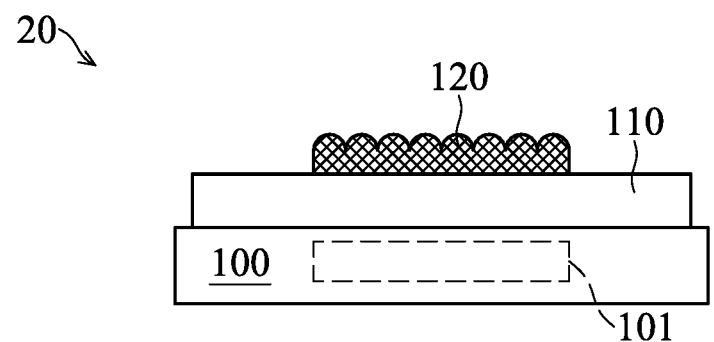

Referring to FIG. 2H, in some embodiments, after the thinning process, a sawing process is performed on the substrate 100 through the opening 111c. More specifically, a sawing process 182 is performed along a direction from the upper surface 100b of the substrate 100 toward the lower surface 100a of the substrate 100 using a dicing saw 180, so that the adjacent chip regions C1 and C2 are separated from each other. For example, when the width of the dicing saw 180 is sufficiently large (e.g., larger than the distance between the opening 111a and the opening 111b), the dielectric layer 110 and the metallic layer 112 located between the opening 111a and the opening 111b are completely removed during the sawing process 162. As a result, a chip package 20 is formed as shown in FIG. 2I. In the chip package 20, the width of the substrate 100 is greater than the width of the dielectric layer 110. Therefore, the chip package 20 has sidewalls with a stepped profile. In such embodiments, the sidewall surface of substrate 100 in the chip package 20 is a sawed surface and the sidewall surface of the dielectric layer 110 is a dry or wet etched surface. However, when the width of the dicing saw 180 is less than the distance between the opening 111a and the opening 111b, the dielectric layer 110 and/or the metal layer 112 located between the opening 111a and the opening 111b may not be completely removed during the sawing process 162. As a result, the openings 111a or openings 111b remain in the chip package, such as the chip package 20a shown in FIG. 2I-1. Both the dielectric layer 110 and the substrate 100 in the chip package 20a have a tilted sidewall surface. The width of the lower surface 110a of the dielectric layer 110 is less than that of the upper surface 100b of the substrate 100 and greater than that of the upper surface 110b of the dielectric layer 110. Moreover, these tilted sidewall surfaces are substantially aligned with each other and extend in the same direction. That is, these tilted sidewall surfaces are level with each other (coplanar). In such embodiments, these tilted sidewall surfaces are sawed surfaces. Additionally, the openings 111a or 111b remained in the chip package 20a expose the upper surface 100b of the substrate 100 and are adjacent to the tilted sidewall surfaces of the dielectric layer 110 and surround the sensing region 101 in the substrate 100

Since the dicing saw 160 is not in contact with the sidewalls of the openings 111a and openings 111b during the sawing process 162, it is also can prevent debris, cracks, or other types of defects from being formed in the dielectric layer 110 surrounded by the openings 111a and openings 111b. Moreover, it can prevent the portion of the dielectric layer 110 surrounded by the opening 111a and the opening 111b from having rough sidewalls.

Figure 3A:
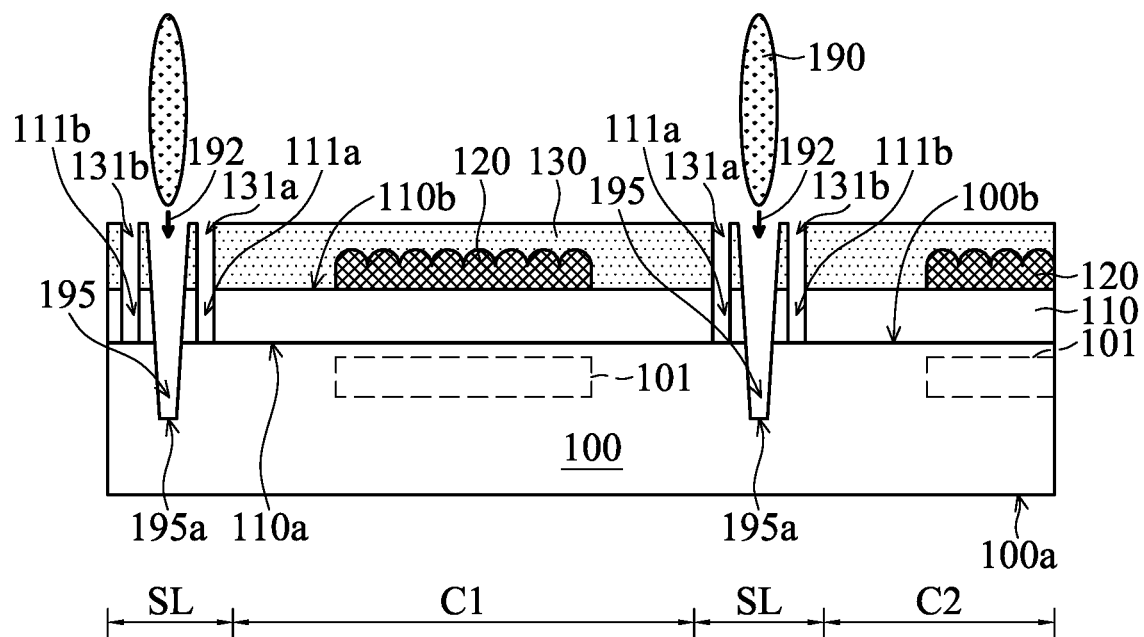
FIGS. 3A to 3C are cross-sectional views of an exemplary method for forming a chip package in accordance with some embodiments of the present disclosure.
Figure 3B:
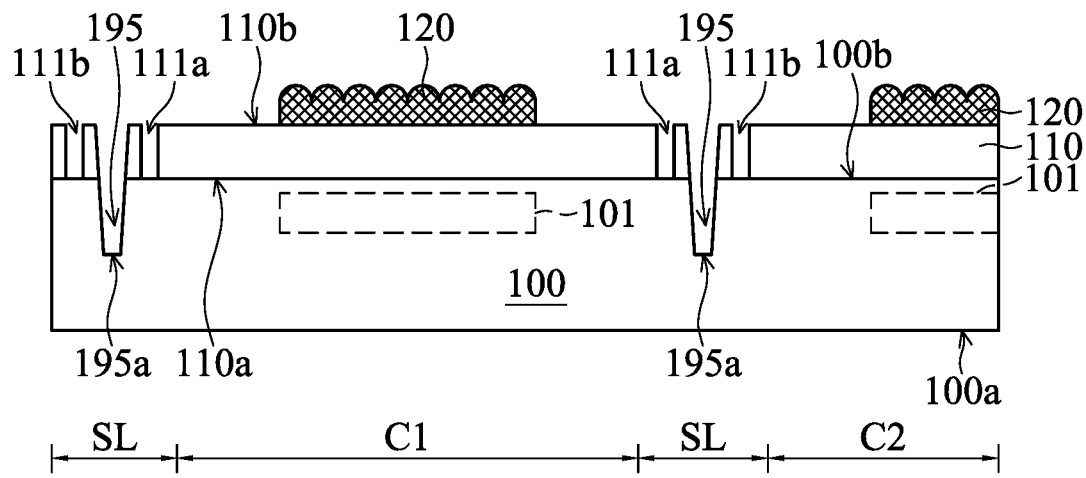
Figure 3C:
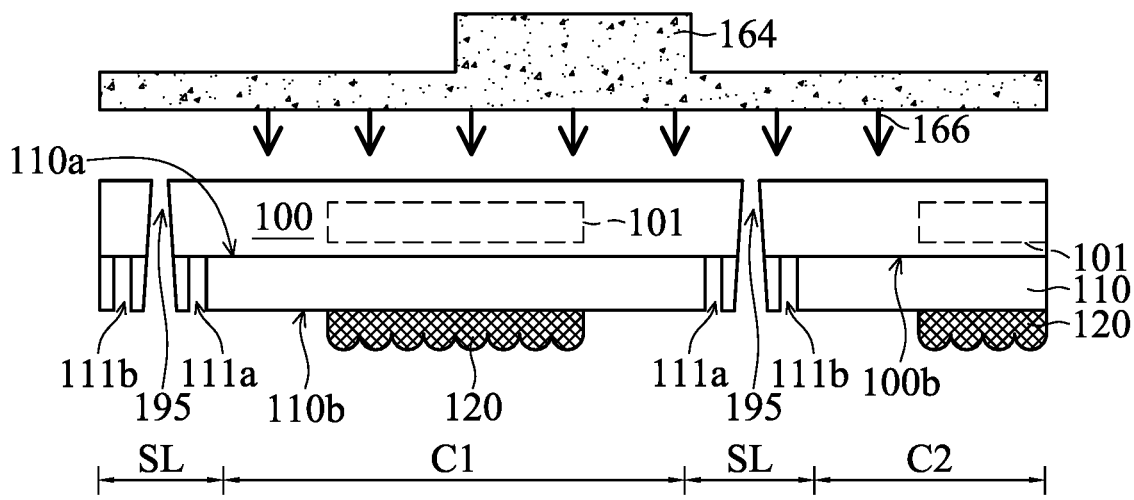

FIGS. 3A to 3C are cross-sectional views of a method for forming a chip package according to some embodiments of the present disclosure, in which elements in FIGS. 3A to 3C that are the same as those in FIGS. 2A to 2I are labeled with the same reference numbers as in FIGS. 2A to 2I and are not described again for brevity. Referring to FIG. 3A, a structure as shown in FIG. 2D is provided. Next, a sawing process is performed sequentially on the masking layer 130, the dielectric layer 110 and the substrate 100. More specifically, a sawing process 192 is performed along a direction from the masking layer 130 toward the lower surface 110a of the dielectric layer 110 using a dicing saw 190, so as to form an opening 195. Unlike the opening 110c shown in FIG. 2E, a bottom 195a of the opening 195 is within the substrate 100. That is, the bottom 195a of the opening 195 is located between the upper surface 100b and the lower surface 100a of the substrate. Moreover, the opening 195 surrounds chip regions C1 and C2 and is located between the opening 111a and the opening 111b. During the sawing process 192, a portion of the metal layer 112 is removed along with the dielectric layer 110. The sawing process 192 is a pre-sawing process. During the sawing process 192, debris, cracks, or other types of defects may be formed in the portion of the dielectric layer 110 that is aligned with the scribe-line region SL. Moreover, the opening 195 may have a rough sidewall. However, since the opening 195 is located between the opening 111a and the opening 111b, the opening 111a and the opening 111b can block these defects formed in the dielectric layer 110 surrounded by the opening 111a and the opening 111b. In other words, since the dicing saw 160 is not contact with the sidewalls of the opening 111a and the opening 111b during the sawing process 192, debris, cracks, or other types of defects can be prevented from being formed in the dielectric layer 110 enclosing the opening 111a and the opening 111b. Moreover, it is also can avoid the portion of the dielectric layer 110 surrounded by the opening 111a and the opening 111b from having rough sidewalls.

Referring to FIG. 3B, in some embodiments, after the opening 195 is formed, the masking layer 130 is removed to expose the dielectric layer 110 and optical element 120. For example, the masking layer 130 may be removed by an ashing process or a wet stripping process to form the structure shown in FIG. 3B. In some embodiments, after removal of the masking layer 130, an optional clean process is performed on the structure shown in FIG. 3B to remove residues (not shown) resulting from the ashing process or the wet stripping process.

Figures 1, 2I:
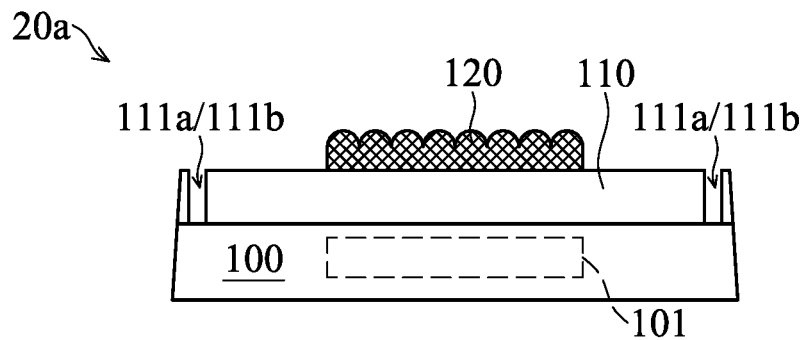

Referring to FIG. 3C, in some embodiments, after removing the masking layer 130 and performing the clean process (if present), a thinning process (e.g., etching process, milling process, grinding process, or polishing process) is performed on the substrate 100 from the lower surface 100a until the opening 195 is exposed. For example, a grinding process 166 is performed on the lower surface 100a from the substrate 100 using a grinding wheel 164 until the opening 195 is exposed, so that the adjacent chip regions C1 and C2 are separated from each other. After the thinning process, individual chip packages can be formed as shown in FIG. 2I or 2I-1. For example, when the width of the dicing saw 190 shown in FIG. 3A is sufficiently large (e.g., larger than the distance between the opening 111a and the opening 111b), the dielectric layer 110 and the metal layer 112 located between the opening 111a and the opening 111b are completely removed during the sawing process 192. As a result, a chip package 20 is formed as shown in FIG. 2I after the thinning process. However, when the width of the dicing saw 190 is less than the distance between the opening 111a and the opening 111b, the dielectric layer 110 and the metal layer 112 located between the opening 111a and the opening 111b may not be completely removed during the sawing process 192 (as shown in FIG. 3A). As a result, after the thinning process, the openings 111a or openings 111b remain in the chip package, such as the chip package 20a shown in FIG. 2I-1. Since individual chip packages can be formed after the thinning process, there is no need to perform additional sawing processes, thereby simplify the process and reducing the manufacturing cost.

Figure 4:
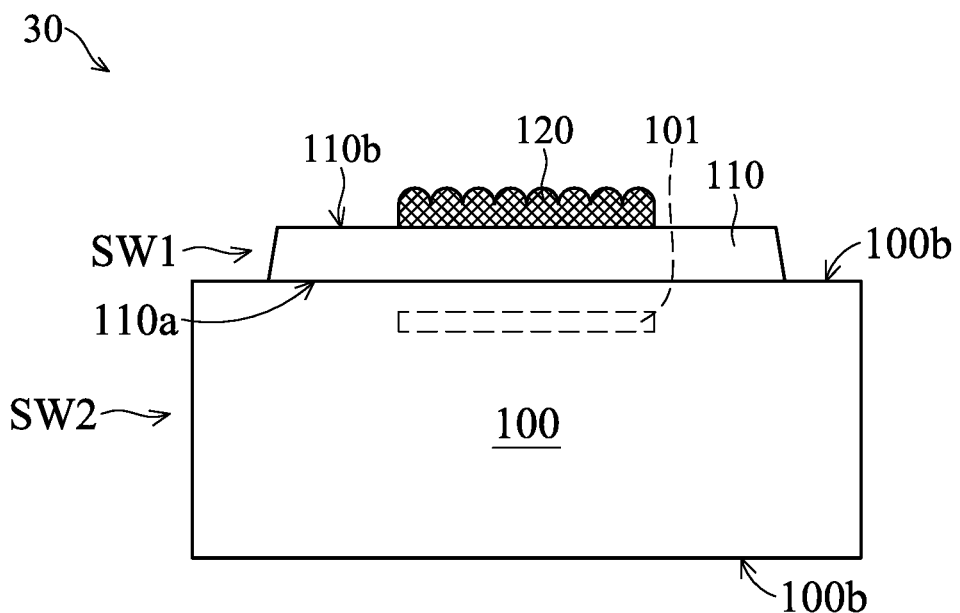
FIG. 4 is a cross-sectional view of an exemplary chip package in accordance with some embodiments of the present disclosure.

FIG. 4 is a cross-section of a chip package 30 according to some embodiments of the present disclosure, in which elements in FIG. 4 that are the same as those in FIG. 1H or 2I are labeled with the same reference numbers as in FIG. 1H or 2I and are not described again for brevity. Referring to FIG. 4, the chip package 30 has a structure similar to that of the chip package 10 (shown in FIG. 1H) and the chip package 20 (shown in FIG. 2I). In some embodiments, the chip package 30 can be formed by the method described in FIGS. 1A to 1H or the method described in FIGS. 2A to 2I.

More specifically, the chip package 30 can be implemented as a front-illuminated (FSI) sensing device and includes: a substrate 100, a dielectric layer 110, and an optical element 120. The substrate 100 has a first surface (e.g., lower surface 100a) and a second surface (e.g., upper surface 100b) opposite the first surface of the substrate 100. Moreover, the substrate 100 has a sensing region 101 adjacent to the second surface of the substrate 100. The dielectric layer 110 has a first surface (e.g., lower surface 110a) and a second surface (e.g., upper surface 110b) opposite the first surface of the dielectric layer 110. The first surface of the dielectric layer 110 adjoins the second surface of the substrate 100. Moreover, the optical element 120 is disposed on the second surface of the dielectric layer 110 and is aligned with the sensing region 101 in the substrate 100.

In some embodiments, the width of the first surface (e.g., lower surface 110a) of the dielectric layer 110 is less than the width of the first surface (e.g., lower surface 100a) of the substrate 100, so that the chip package 30 has sidewalls with stepped profile. In such embodiments, the dielectric layer 110 has a tilted sidewall surface SW1 and substrate 100 has a substantially vertical sidewall surface SW2. In some embodiments, the tilted sidewall surface SW1 of dielectric layer 110 is a dry or wet etched surface and the substantially vertical sidewall surface SW2 of substrate 100 is a sawed surface.

In some embodiments, unlike the dielectric layer 110 in the structure of the chip package 10 (shown in FIG. 1H) and the chip package 20 (shown in FIG. 2I), prior to singulation, a portion of the dielectric layer 110 that corresponds to the scribe-line region SL does not have metal layers (as shown by the metal layers 112 in FIG. 1A or 2A). For example, the entire scribe-line region SL is a metal-free region (as shown by the metal-free region 115 in FIG. 1A).

Figure 5:
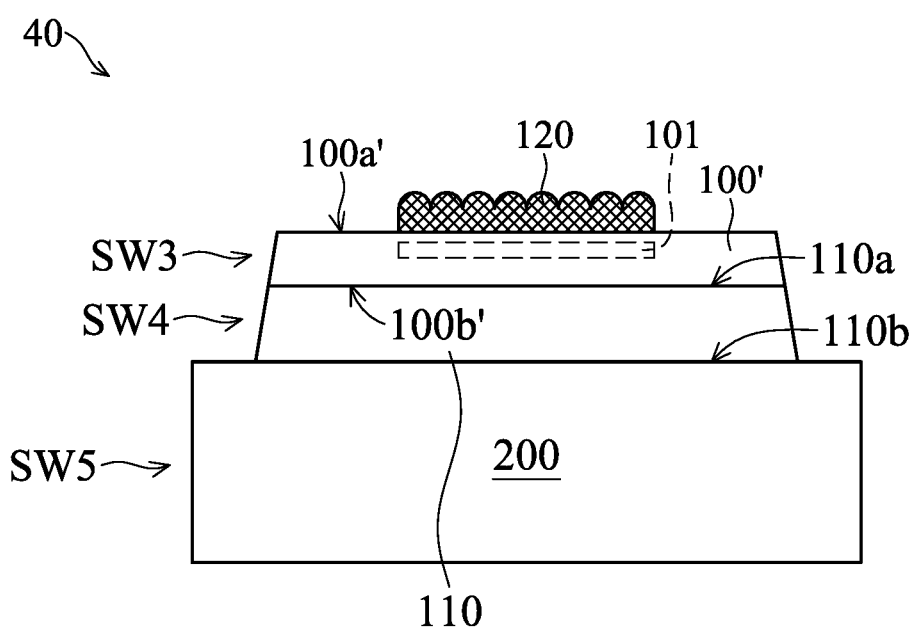
FIG. 5 is a cross-sectional view of an exemplary chip package in accordance with some embodiments of the present disclosure.

FIG. 5 is a cross-section of a chip package 40 according to some embodiments of the present disclosure, in which elements in FIG. 5 that are the same as those in FIG. 1H, 2I or 4 are labeled with the same reference numbers as in FIG. 1H, 2I or 4 and are not described again for brevity. Referring to FIG. 5, in some embodiments, the chip package 40 can be formed by the method described in FIGS. 1A to 1H, the method described in FIGS. 2A to 2I, or the method described in FIGS. 3A to 3C.

More specifically, the chip package 40 can be implemented as a back-illuminated (BSI) sensing device and includes: a substrate 100', a dielectric layer 110, and an optical element 120. The substrate 100' has a composition that is the same as or similar to the aforementioned substrate 100 and has a first surface (e.g., a lower surface 100a') and a second surface (e.g., an upper surface 100b') opposite the first surface of the substrate 100'. Moreover, unlike the substrate 100, the sensing region 101 in substrate 100' is adjacent to the first surface of substrate 100'. The dielectric layer 110 has a first surface (e.g., lower surface 110a) and a second surface (e.g., upper surface 110b) opposite the first surface of the dielectric layer 110, and the first surface of the dielectric layer 110 adjoins the second surface of the substrate 100'. Moreover, the optical element 120 is disposed on the first surface of the substrate 100' and is aligned with the sensing region 101 in the substrate 100' to form a back-illuminated (BSI) sensing device.

In some embodiments, the substrate 100' has a first tilted sidewall surface SW3 and the dielectric layer 110 has a second tilted sidewall surface SW4 substantially aligned with the first tilted sidewall surface SW3. Moreover, the first tilted sidewall surface SW3 and the second tilted sidewall surface SW4 extend in the same direction. That is, the first tilted sidewall surface SW3 and the second tilted sidewall surface SW4 are level to each other (coplanar). In some embodiments, the first tilted sidewall surface SW3 and the second tilted sidewall surface SW4 are dry or wet etched surfaces.

In some embodiments, the width of the second surface (e.g., the upper surface 100b') of the substrate 100' is greater than the width of the first surface (e.g., the lower surface 100a') of the substrate 100' and less than the width of the second surface (e.g., the upper surface 110b) of the dielectric layer 110.

In some embodiments, the chip package 40 further includes a carrier substrate 200 adjoining the second surface (e.g., the upper surface 110b) of the dielectric layer 110. The carrier substrate 200 may be made of glass, quartz, silicon, semiconductor material, or other suitable substrate material.

In some embodiments, the carrier substrate 200 has a substantially vertical sidewall surface SW5, and the width of the carrier substrate 200 is greater than the width of the second surface (e.g., the upper surface 110b) of the dielectric layer 110, so that the chip package 30 has sidewalls with stepped profile. In some embodiments, the substantially vertical sidewall surface SW5 of the carrier substrate 200 is a sawed surface.

In some embodiments, prior to singulation, a portion of the dielectric layer 110 corresponding to the scribe-line region SL has metal layers 112 (as shown by the metal layers 112 in FIG. 1A or 2A) or not. For example, the entire scribe-line region SL is a metal-free region (as shown as metal-free region 115 in FIG. 1A).

Figure 6:
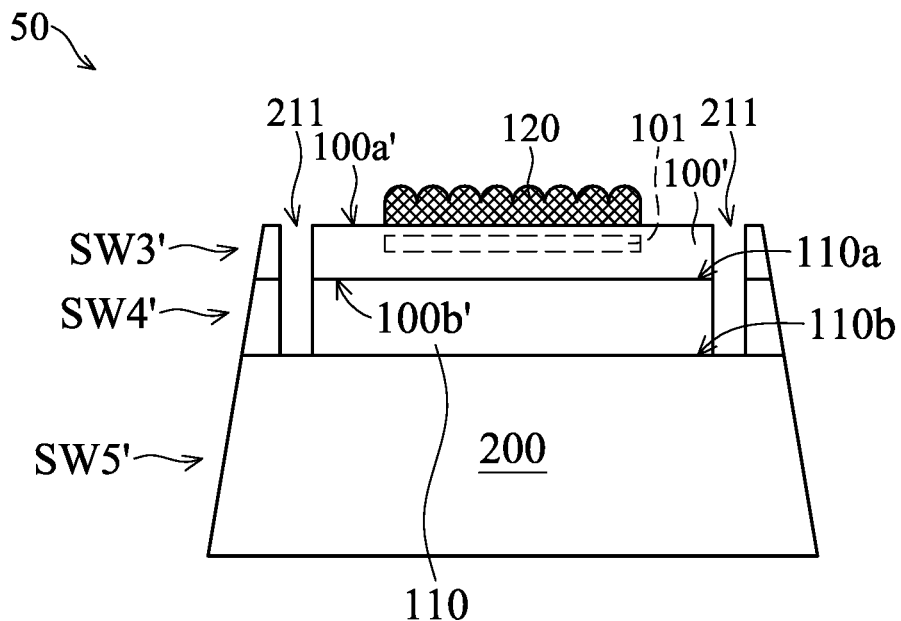
FIG. 6 is a cross-sectional view of an exemplary chip package in accordance with some embodiments of the present disclosure.

FIG. 6 is a cross-section of a chip package 50 according to some embodiments of the present disclosure, in which elements in FIG. 6 that are the same as those in FIG. 5 are labeled with the same reference numbers as in FIG. 5 and are not described again for brevity. Referring to FIG. 6, in some embodiments, the chip package 40 can be formed by the method described in FIGS. 2A to 2I or the method described in FIGS. 3A to 3C.

The chip package 50 has a structure similar to that of the chip package 40 (as shown in FIG. 5), and includes: a substrate 100', a dielectric layer 110, an optical element 120, and a carrier substrate 200. The configuration of substrate 100', dielectric layer 110 and optical element 120 in chip package 50 forms a back-illuminated (BSI) sensing device.

In some embodiments, the substrate 100' has a first tilted sidewall surface SW3' and the dielectric layer 110 has a second tilted sidewall surface SW4'. Unlike the chip package 40, the substrate 200 in the chip package 50 has a third tilted sidewall surface SW5' substantially aligned with the second tilted sidewall surface SW4', and the third tilted sidewall surface SW5' and the first and second tilted sidewall surfaces SW3' and SW4' extend in the same direction. That is, the first, second and third tilted sidewall surfaces SW3', SW4' and SW5' are level to each other (co-planar). In such embodiments, the first, second, and third tilted sidewall surfaces SW3', SW4', and SW5' are sawed surfaces.

In some embodiments, prior to singulation, a portion of the dielectric layer 110 corresponding to the scribe-line region SL has metal layers 112 (as shown by the metal layers 112 in FIG. 1A or 2A). For example, the entire scribe-line region SL is a metal-free region (as shown by the metal-free region 115 in FIG. 1A).

In some embodiments, unlike the chip package 40 shown in FIG. 5, the chip package 50 further includes an opening 211 extending from a first surface (e.g., lower surface 100a') of the substrate 100' to a second surface (e.g., upper surface 110b) of the dielectric layer 110. Moreover, the opening 211 is adjacent to the first tilted sidewall surface SW3' and the second tilted sidewall surface SW4' and surrounds the sensing region 101.

Figure 7:
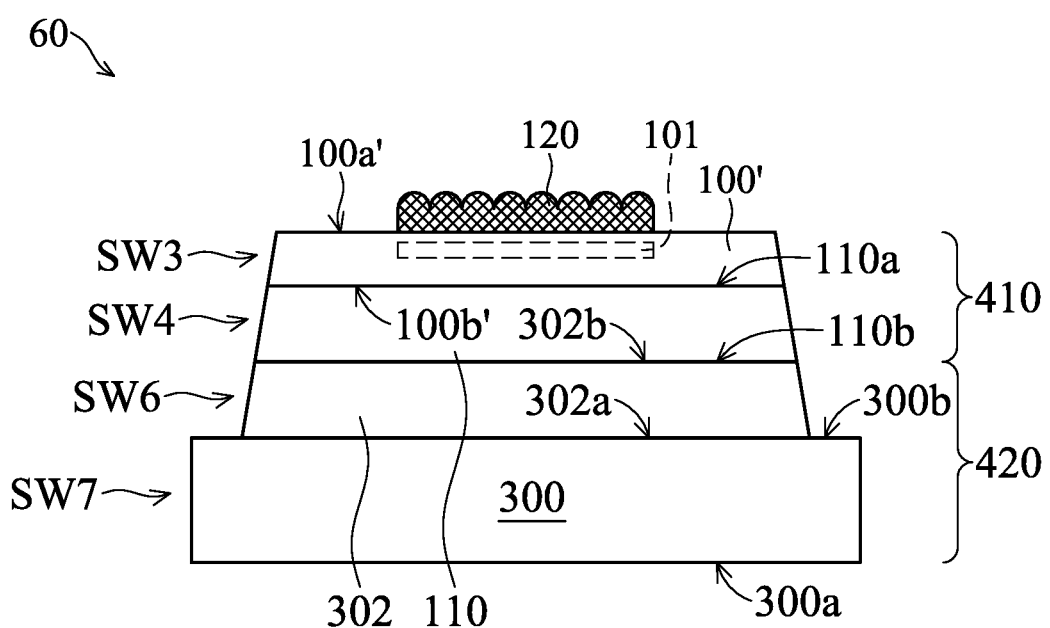
FIG. 7 is a cross-sectional view of an exemplary chip package in accordance with some embodiments of the present disclosure.

FIG. 7 is a cross-section of a chip package 60 according to some embodiments of the present disclosure, in which elements in FIG. 7 that are the same as those in FIG. 5 are labeled with the same reference numbers as in FIG. 5 and are not described again for brevity. Referring to FIG. 7, in some embodiments, the chip package 60 can be formed by the method described in FIGS. 1A to 1H, the method described in FIGS. 2A to 2I above, or the method described in FIGS. 3A to 3C. In some embodiments, the chip package 60 can be implemented as a chip stack of a back-illuminated (BSI) sensing device with another semiconductor device (e.g., an application-specific integrated circuit (ASIC) chip, a memory chip, or a system-on-chip (SoC)).

More specifically, the chip package 60 includes a first chip 410 and a second chip 420 stacked below the first chip 410. In some embodiments, the first chip 410 includes a substrate 100', a dielectric layer 110, and an optical element 120. Moreover, the substrate 100', the dielectric layer 110 and the optical element 120 in the first wafer 410 have the same configuration and structure as those of the substrate 100', the dielectric layer 110 and the optical element 120 in the chip package 40 of FIG. 5 to form a back-illuminated (BSI) sensing device, such as a back-illuminated (BSI) image-sensing device.

In some embodiments, the substrate 100' and the dielectric layer 110 in the first chip 410 have a first tilted sidewall surface SW3 and a second tilted sidewall surface SW4, respectively. The first tilted sidewall surface SW3 and the second tilted sidewall surface SW4 are level to each other (coplanar). In some embodiments, the first tilted sidewall surface SW3 and the second tilted sidewall surface SW4 are dry or wet etched surfaces. In some embodiments, the width of the second surface (e.g., the upper surface 100b') of the substrate 100' is greater than the width of the first surface (e.g., the lower surface 100a') of the substrate 100' and less than the width of the second surface (e.g., upper surface 110b) of the dielectric layer 110.

In some embodiments, the second chip 420 is an application-specific integrated circuit (ASIC) chip, a memory chip, or a system-on-chip (SoC), and includes: a substrate 300 and a dielectric layer 302. The substrate 300 has a first surface (e.g., lower surface 300a) and a second surface (e.g., upper surface 300b) opposite the first surface of the substrate 300. In some embodiments, the substrate 300 has a substantially vertical sidewall surface SW7. Moreover, the substantially vertical sidewall surface SW7 of the substrate 300 is a sawed surface. In some embodiments, the substrate 300 is a silicon substrate or another semiconductor substrate.

The dielectric layer 302 has a first surface (e.g., lower surface 302a) and a second surface (e.g., upper surface 302b) opposite the first surface of the dielectric layer 302, and the first surface and the second surface of the dielectric layer 302 adjoin the second surface (e.g., upper surface 300b) of the substrate 300 and the second surface (e.g., upper surface 110b) of the dielectric layer 110, respectively. In some embodiments, the width of the second surface of the dielectric layer 302 is less than the width of the substrate 300. Moreover, the dielectric layer 302 has a third tilted sidewall surface SW6 substantially aligned with the second tilted sidewall surface SW4, and the third tilted sidewall surface SW6 and the second tilted sidewall surface SW4 extend in the same direction, so that the third tilted sidewall surface SW6, the second tilted sidewall surface SW4 and the first tilted sidewall surface SW3 are level to each other (coplanar).

Figure 8:
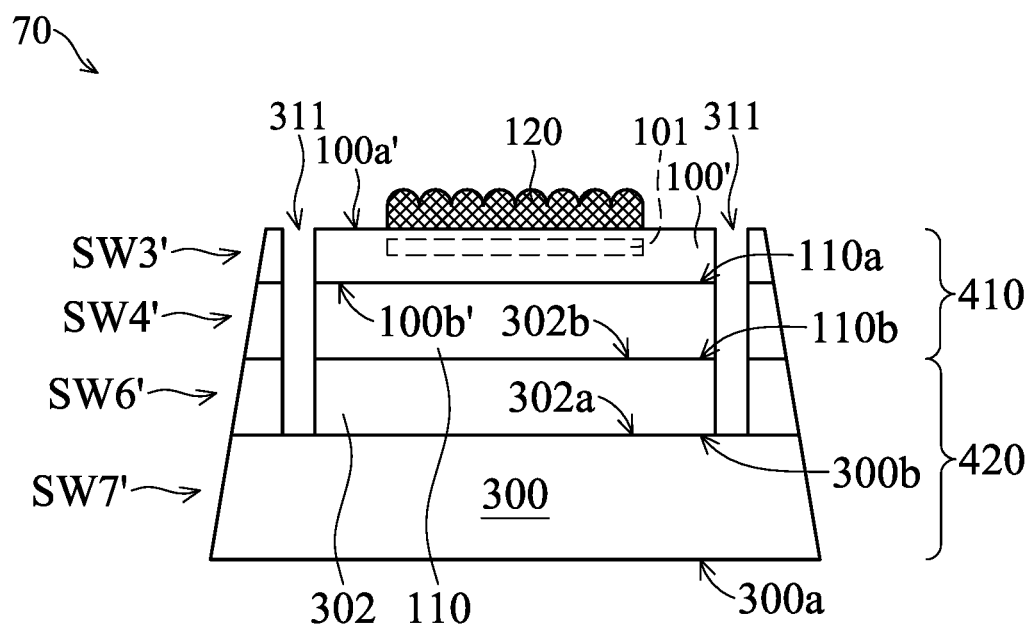
FIG. 8 is a cross-sectional view of an exemplary chip package in accordance with some embodiments of the present disclosure.

FIG. 8 is a cross-section of a chip package 70 according to some embodiments of the present disclosure, in which elements in FIG. 8 that are the same as those in FIG. 7 are labeled with the same reference numbers as in FIG. 7 and are not described again for brevity. Referring to FIG. 8, in some embodiments, the chip package 70 can be formed by the method described in FIGS. 2A to 2I or the method described in FIGS. 3A to 3C.

The structure of the chip package 70 is similar to the structure of the chip package 60 (as shown in FIG. 7). The difference is that the substrate 100' and the dielectric layer 110 in the first chip 410 have a first tilted sidewall surface SW3' and a second tilted sidewall surface SW4', respectively. The dielectric layer 302 and the substrate 300 in the second chip 420 have a third tilted sidewall surface SW6' and a fourth tilted sidewall surface SW7', respectively. Moreover, the first, second, third and fourth tilted sidewall surfaces SW3', SW4', SW6' and SW7' are substantially aligned with each other and extend in the same direction, so that these tilted sidewall surfaces are level to each other (coplanar). In such embodiments, the first, second, third and fourth tilted sidewall surfaces SW3', SW4', SW6' and SW7' are sawed surfaces.

Unlike the chip package 60 shown in FIG. 7, the chip package 70 further includes an opening 311 extending from a first surface (e.g., lower surface 100a') of the substrate 100' to a first surface (e.g., lower surface 302a) of the dielectric layer 302 to expose the substrate 300. Moreover, the opening 311 is adjacent to the first, second, and third tilted sidewall surfaces SW3', SW4', and SW6' and surrounds the sensing region 101. The width of the first surface (e.g., the lower surface 300a) of the substrate 300 is less than the width of the first surface (e.g., the lower surface 300a) of the substrate 300.

According to the aforementioned embodiments, an etching process is used instead of a conventional laser or dicing saw technique as a pre-dicing process to form a pre-dicing opening in a low k dielectric layer. Alternatively, an etching process is used to form an opening adjacent to the pre-cutting region of the dielectric layer before the pre-sawing process is performed using a dicing saw. As a result, it can prevent debris, cracks, or other types of defects from being formed in the dielectric layer due to mechanical or thermal stresses during the pre-sawing process. Therefore, during subsequent wafer dicing with the dicing saw, the dicing saw can avoid from being in contact with the dielectric layer via the opening formed by the etching process, thereby preventing mechanical or thermal stress from being applied to the dielectric layer. As a result, the reliability of the chip package is increased. According to the above embodiment, the roughness of the sidewalls of the dielectric layer is reduced because the pre-sawing opening is formed by the etching process. Moreover, the size of the pre-sawing opening can be precisely controlled, thereby increasing the process window of the subsequent sawing process.

While the invention has been disclosed in terms of the preferred embodiments, it is not limited. The various embodiments may be modified and combined by those skilled in the art without departing from the concept and scope of the invention.

What is claimed is:

1. A chip package, comprising:
   a substrate having a first surface and a second surface opposite the first surface of the substrate, and having a sensing region in the substrate;
   a dielectric layer having a first surface and a second surface opposite the first surface of the dielectric layer, wherein the first surface of the dielectric layer adjoins the second surface of the substrate; and
   an optical element disposed over the substrate and aligned with the sensing region,
   wherein a width of the first surface of the dielectric layer is different than a width of the first surface of the substrate, and the dielectric layer has a tilted sidewall surface surrounding the optical element and the sensing region.

2. The chip package as claimed in claim 1, wherein the substrate has a substantially vertical sidewall surface.

3. The chip package as claimed in claim 2, wherein the tilted sidewall surface of the dielectric layer is a dry or wet etched surface, and the substantially vertical sidewall surface of the substrate is a sawed surface.

4. The chip package as claimed in claim 1, wherein the substrate has a tilted sidewall surface, and a width of the first surface of the dielectric layer is greater than a width of the second surface of the substrate.

5. The chip package as claimed in claim 4, wherein the dielectric layer has an opening exposing the second surface of the substrate, wherein the opening is adjacent to the tilted sidewall surface of the dielectric layer and surrounds the sensing region.

6. The chip package as claimed in claim 4, wherein a width of the first surface of the dielectric layer is greater than a width of the second surface of the dielectric layer.

7. A chip package, comprising:
   a first substrate having a first surface and a second surface opposite the first surface of the first substrate, and having a sensing region adjacent to the first surface of the first substrate;
   a dielectric layer having a first surface and a second surface opposite the first surface of the dielectric layer, and the first surface of the dielectric layer adjoining the second surface of the first substrate; and an optical element disposed on the first surface of the first substrate and aligned with the sensing region, wherein the first substrate has a first tilted sidewall surface and the dielectric layer has a second tilted sidewall surface substantially aligned with the first tilted sidewall surface, wherein the first tilted sidewall surface and the second tilted sidewall surface extend in a same direction and surround the optical element and the sensing region.

8. The chip package as claimed in claim 7, wherein a width of the second surface of the first substrate is greater than a width of the first surface of the first substrate and less than the second surface of the dielectric layer.

9. The chip package as claimed in claim 7, wherein the first tilted sidewall surface and the second tilted sidewall surface are dry or wet etched surfaces.

10. The chip package as claimed in claim 8, further comprising a second substrate disposed below the second surface of the dielectric layer.

11. The chip package as claimed in claim 10, wherein the second substrate has a substantially vertical sidewall surface, and a width of the second substrate is greater than a width of the second surface of the dielectric layer.

12. The chip package as claimed in claim 11, wherein the substantially vertical sidewall surface is a sawed surface.

13. The chip package as claimed in claim 10, wherein the second substrate is a carrier substrate that has a third tilted sidewall surface substantially aligned with the second tilted sidewall surface, wherein the third tilted sidewall surface and the second tilted sidewall surface extend in a same direction.

14. The chip package as claimed in claim 10, wherein an opening extends from the first surface of the first substrate to the second surface of the dielectric layer to expose the second substrate, wherein the opening is adjacent to the first tilted sidewall surface and the second tilted sidewall surface, and surrounds the sensing region.

15. A chip package, comprising:
a first chip, comprising:
a first substrate having a first surface and a second surface opposite the first surface of the first substrate, and having a sensing region adjacent to the first surface of the substrate;
a first dielectric layer having a first surface and a second surface opposite the first surface of the first dielectric layer, and the first surface of the first dielectric layer adjoining the second surface of the first substrate; and
an optical element disposed on the first surface of the first substrate and aligned with the sensing region; and
a second chip disposed below the first chip,
wherein the first substrate has a first tilted sidewall surface and the first dielectric layer has a second tilted sidewall surface substantially aligned with the first tilted sidewall surface, wherein the first tilted sidewall surface and the second tilted sidewall surface extend in a same direction and surround the optical element and the sensing region.

16. The chip package as claimed in claim 15, wherein a width of the second surface of the first substrate is greater than a width of the first surface of the first substrate and less than a width of the second surface of the first dielectric layer.

17. The chip package as claimed in claim 15, wherein the second chip comprises:
a second substrate having a first surface and a second surface opposite the first surface of the second substrate; and
a second dielectric layer having a first surface and a second surface opposite the first surface of the second dielectric layer, and the first surface and the second surface of the second dielectric layer adjoining the second surface of the second substrate and the second surface of the first dielectric layer, respectively,
wherein the second substrate has a substantially vertical sidewall surface, and a width of the second substrate is greater than a width of the second surface of the second dielectric layer, wherein the second dielectric layer has a third tilted sidewall surface substantially aligned with the second tilted sidewall surface, wherein the third tilted sidewall surface and the second tilted sidewall surface extend in a same direction.

18. The chip package as claimed in claim 17, wherein the substantially vertical sidewall surface is a sawed surface.

19. The chip package as claimed in claim 15, wherein the second chip comprises:
a second substrate having a first surface and a second surface opposite the first surface of the second substrate; and
a second dielectric layer having a first surface and a second surface opposite the first surface of the second dielectric layer, and the first surface and the second surface of the second dielectric layer adjoining the second surface of the second substrate and the second surface of the first dielectric layer, respectively,
wherein the second dielectric layer and the second substrate have a third tilted sidewall surface and a fourth tilted sidewall surface, respectively, and the first, the second, the third, and the fourth tilted sidewall surfaces are substantially level with each other and extend in a same direction.

20. The chip package as claimed in claim 19, wherein an opening extends from the first surface of the first substrate to the first surface of the second dielectric layer to expose the second surface of the second substrate, wherein the opening is adjacent to the first, the second, and the third tilted sidewall surfaces, and surrounds the sensing region.

21. The chip package as claimed in claim 19, wherein a width of the first surface of the second dielectric layer is greater than a width of the second surface of the first dielectric layer and less than a width of the first surface of the second substrate.

22. The chip package as claimed in claim 15, wherein the first chip comprises an image-sensing device.

23. The chip package as claimed in claim 15, wherein the second chip is an application-specific integrated circuit chip, a memory chip, or a system-on-chip.

* * * * *